United States Patent [19]

Upadhyayula

[11] Patent Number: 4,580,114
[45] Date of Patent: Apr. 1, 1986

[54] ACTIVE ELEMENT MICROWAVE POWER COUPLER

[75] Inventor: Lakshminarasimha C. Upadhyayula, East Windsor Township, Mercer County, N.J.

[73] Assignee: RCA Corporation, Princeton, N.J.

[21] Appl. No.: 650,654

[22] Filed: Sep. 14, 1984

[51] Int. Cl.[4] .............................................. H03H 7/21
[52] U.S. Cl. .................................... 333/100; 307/513; 307/571; 333/136; 333/139
[58] Field of Search ............... 333/100, 103, 104, 124, 333/125, 128, 136, 138, 139; 307/513, 529, 571, 572

[56] References Cited

U.S. PATENT DOCUMENTS

| 3,976,958 | 8/1976 | Seidel |  |
|---|---|---|---|
| 4,283,684 | 8/1981 | Satoh |  |
| 4,308,473 | 12/1981 | Carnes | 307/529 |
| 4,398,161 | 8/1983 | Lamb et al. |  |
| 4,409,557 | 10/1983 | Sechi | 330/277 |
| 4,472,691 | 9/1984 | Kumar et al. | 333/103 |
| 4,511,813 | 4/1985 | Pan | 333/104 X |

OTHER PUBLICATIONS

"Performance of Dual-Gate GaAs MESFET's as Gained-Controlled Low-Noise Amplifiers and High--Speed Modulators" by C. A. Liechti, IEEE Transactions on Microwave Theory and Techniques, vol. MTT-23, No. 6, Jun. 1975, pp. 461–469.

Primary Examiner—Paul Gensler
Attorney, Agent, or Firm—Joseph S. Tripoli; Robert L. Troike; Robert Ochis

[57] ABSTRACT

Microwave couplers such as power splitters and combiners for coupling a common terminal to two branch terminals are disclosed which are compact and provide gain. Each leg of the branching circuit comprises a dual gate FET device. The dual gate FET device has its first gate connected to receive an input signal, its second gate biased and terminated in accordance with the phase shift desired from that FET device and its drain coupled to provide an output signal. Where equal phases are desired from both legs, the second gates of all of the FET devices are capacitively terminated. Where a differential phase shift is desired over the two legs, the second gate of the FET device in one leg is capacitively terminated and the second gate of the FET device in the other leg is inductively terminated. The bias voltages on the second gates are preferably selected to produce the same gain for both. Coupling the first gates of both legs to the common terminal and the drains to separate branch terminals yields a power splitter. Coupling the two drains to the common terminal and the first gates to separate branch terminals yields a power combiner.

10 Claims, 5 Drawing Figures

ACTIVE ELEMENT MICROWAVE POWER COUPLER

The Government has rights in this invention pursuant to Contract No. N00014-79-C-0568 awarded by the Department of the Navy.

RELATED APPLICATION

This patent is related to my patent application entitled, "ACTIVE ELEMENT MICROWAVE PHASE SHIFTER", Ser. No. 650,655, co-filed herewith on Sept. 14,1984, assigned to the present assignee, and incorporated herein by reference.

BACKGROUND OF THE INVENTION

The present invention relates to microwave couplers and more particularly to microwave branching couplers such as power splitters and combiners.

For proper operation, many microwave radio frequency (RF) circuits must have two isolated signals derived from a single signal or must have two such signals combined into one. These signals, may need to be equal in phase or may need to be in phase quadrature. Branching circuits provide such signal conversion. Power splitters are used to produce two such signals from one. Power combiners are used to combine two such signals into one. In prior art strip transmission line microwave circuits such branching circuits are usually either of the interdigitated or Wilkinson type. A strip transmission line circuit is one in which microwave signals are carried by narrow strip conductors spaced by a dielectric region from at least one substantially wider ground conductor. A microstrip circuit is a special case of a strip transmission line circuit in which the strip conductors are disposed on one major surface of a solid dielectric substrate and a single wider ground conductor is disposed on the other major surface of that substrate.

Both interdigitated and Wilkinson couplers require a relatively large substrate surface area for their implementation. This is a significant drawback where the microwave circuit is intended for use in a system which must be compact or lightweight or both. A further drawback of such couplers is the fact that they are lossy with the result that both of the signals emerging from an equal-power power splitter have powers which are more than 3 dB below the level of the incoming signal. Similarly, the power emerging from the common terminal of a combiner is less than the sum of the powers entering the branch terminals. Compact branching circuits are needed which produce a lesser loss or some gain.

SUMMARY OF THE INVENTION

This need is supplied by an RF coupler having first and second leads each having one end joined to a common terminal and the other end coupled to a different branch terminal through an associated dual gate FET device whose second gate is reactively terminated. A capacitive termination yields a transmission phase shift which is substantially independent of second gate DC bias while an inductive termination yields a transmission phase shift which varies substantially linearly with second gate DC bias over a range of bias voltages. The reactances and the bias voltages applied to the dual gate FETs are selected to provide a reference transmission phase shift between the common terminal and one of the branch terminals and a desired relative phase shift between the common terminal and the other branch terminal. When a relative phase shift of 90° is desired, it is preferred to have two dual gate FETs connected in series in the path between the common terminal and each of the branch terminals.

DETAILED DESCRIPTION OF THE PREFERRED EMBODIMENT

Figure 1:
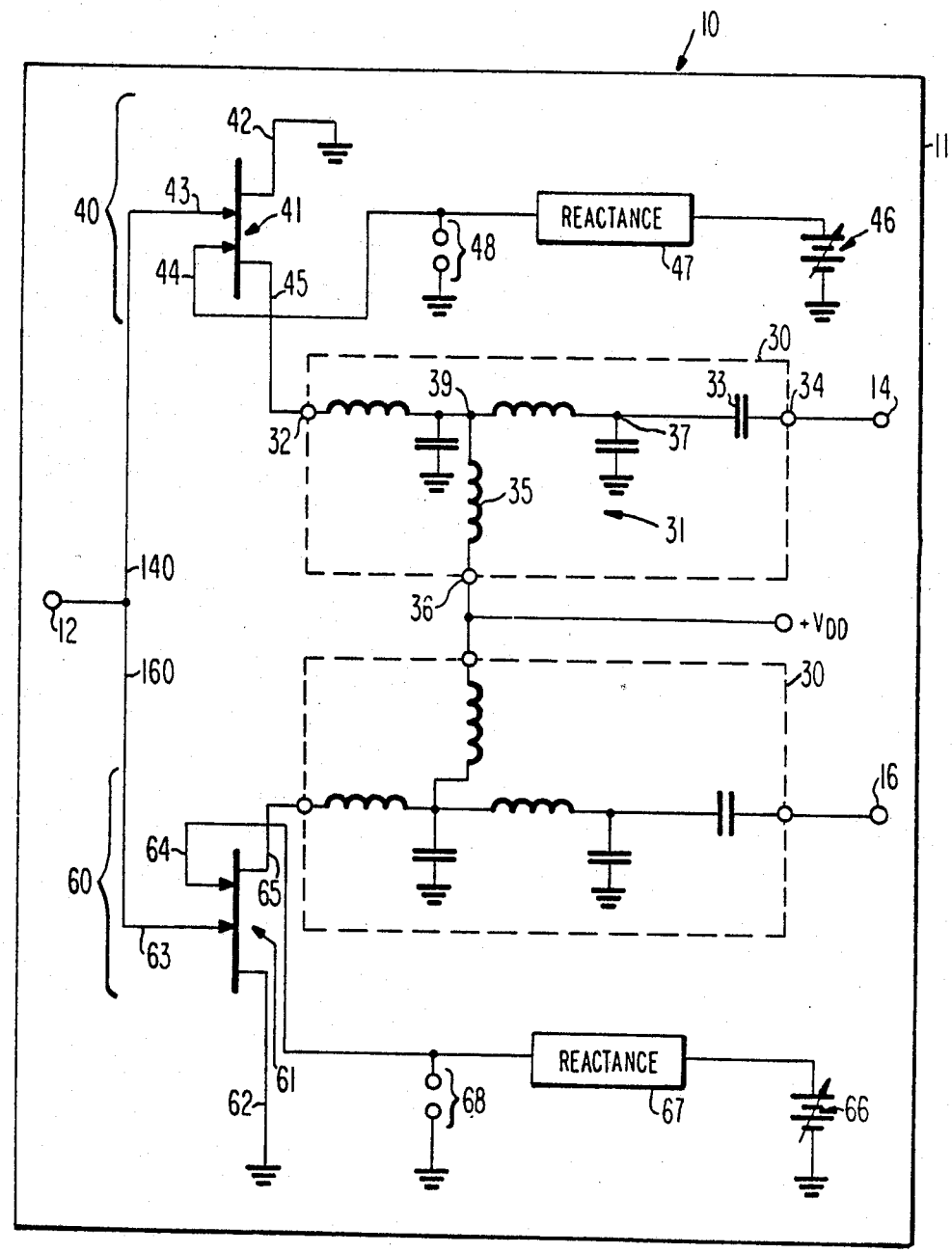
FIG. 1 is a schematic circuit diagram of a power splitter in accordance with the present invention which can produce a 45° relative phase difference between its output signals.

In FIG. 1 a two-output, microwave integrated circuit power splitter 10 in accordance with the present invention has a common input terminal 12 and two branch (output) terminals 14 and 16. Branch terminal 14 is connected to the common input terminal 12 by a coupling path or leg 40. The path 40 comprises a lead 140 coupled at a first end to terminal 12 and at a second end to a dual gate FET device 41 having a source 42, a first gate 43, a second gate 44 and a drain 45. The first gate of a dual gate FET device is the gate which is closest to the source. All of the FET devices in these circuits are microwave devices and may preferably be GaAs MESFETs. A MESFET is a metal semiconductor field effect transistor. N channel depletion mode MESFETs are preferred. The second end of conductor lead 140 is connected to the first gate 43 of FET device 41. The source 42 is connected for the example to a ground reference potential. The second gate 44 is coupled to a controllable DC (direct current) bias source 46, and is reactively terminated via a reactance 47. The drain 45 of the FET device 41 is coupled for the example to a positive voltage supply $V_{DD}$ and output terminal 14 via a three terminal coupling network 30. Network 30 has terminals 32, 34 and 36 connected respectively to drain 45, output terminal 14 and bias supply $+V_{DD}$. Network 30 includes a matching network 31 connected between terminal 32 and an internal node 37, a DC blocking capacitor 33 connected between node 37 and terminal 34 and an RF choke 35 connected between a node 39 and terminal 36. Capacitor 33 prevents the current from flowing to terminal 14 and choke 35 prevents the RF (radio frequency) signal from reaching the $V_{DD}$ bias supply and its buses. Matching network 31 is in the form of an LC bandpass filter which provides impedance transformation to match the drain impedance of FET device 41 to the load impedance to be connected to terminal 14. The detailed structure of the bandpass filter 31 depends on the bandwidth over which it is desired to operate the power splitter and the impedances between which the filter is to provide transformation.

Branch terminal 16 is connected to the common input terminal 12 via a coupling path or leg 60 comprising lead 160 and a dual gate FET device 61. FET device 61 has its source 62 connected for the example to ground potential. The first gate 63 of the FET device 61 is connected by the conductor lead 160 to the common input terminal 12. The second gate 64 is connected to a controllable source of DC bias potential 66 and is reactively terminated by a reactance 67. The drain 65 of transistor 61 is connected via another coupling network 30 to a positive voltage supply $V_{DD}$ and to terminal 16.

An LC matching network may be included between common terminal 12 and the first gates 43 and 63 of FET devices 41 and 61 if it is desired to improve the match between power splitter 10 and the source of its input signal.

The branching circuit 10 is fabricated as a gallium arsenide (GaAs) integrated circuit on a GaAs chip 11. The coupling networks 30 and the terminating reactances 47 and 67 are preferably fabricated directly on the GaAs chip. However, external components may be used where larger values are needed than can be conveniently fabricated on the chip.

In a microwave circuit, the integrated power splitter 10 is preferably physically disposed between the two portions of the stripline, microstrip or other circuit it connects. Jumper conductors connect each of the terminals 12, 14 and 16 to the appropriate conductors on the coupled circuits.

In operation, the DC voltages applied from the source to the drain and between the source and the second gate 44 of transistor 41 bias transistor 41 at a point on its operating curve where it provides gain.

The RF signal connected to first gate 43 modulates the source-drain current of transistor 41. The effect of the reactance 47 is discussed hereinafter. Because of the gain of the FET device, the signal at terminal 14 can be at a power level which is more than half of the input power level at terminal 12. Since the input power is divided evenly between the two paths 40 and 60, the coupling path 40 can provide power gain from common terminal 12 to branch terminal 14. The operation of transistor 61 and path 60 is similar.

Isolation between the branch terminals 14 and 16 is provided by the RF chokes in the coupling circuits 30 and by the high isolation between a signal applied to the drain of an FET device and the signal at its gate(s).

If the reactance which terminates the second gate 44 of FET device 41 or gate 64 of FET device 61 is a capacitance, then the transmission phase shift through the transistor is substantially constant over a substantial range of DC bias voltages. This can be seen from curve 302 of FIG. 4. Because of this almost constant phase shift, the phase shift through such a capacitively terminated transistor is taken as a reference phase shift.

Figure 4:
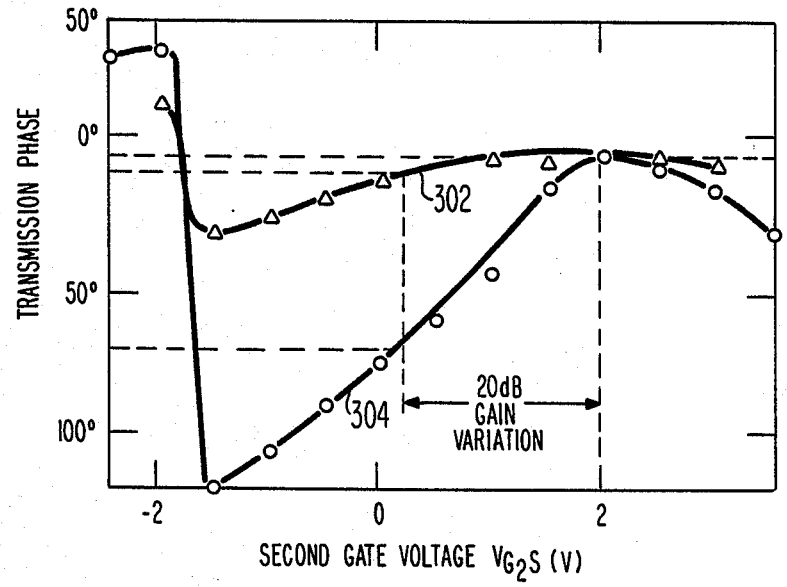
FIGS. 4 and 5 illustrate characteristic curves of a dual gate FET which are useful in explaining the operation of a power splitter in accordance with the present invention.

If the terminating reactance is an inductance, then the transmission phase shift varies substantially linearly with DC bias voltage over a substantial range of bias voltages as can be seen from curve 304 of FIG. 4.

Figure 5:
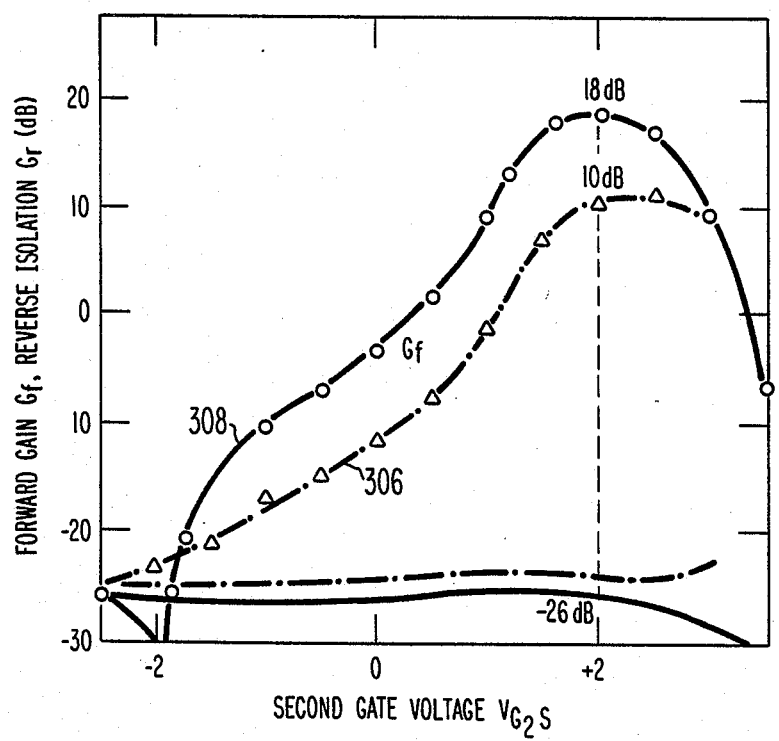

The curves of FIG. 5 show that the gain of the FET device varies with bias in either case. Curve 306 represents capacitive termination and curve 308 represents inductive termination. Curves 302, 304, 306, and 308 are for a drain-to-source voltage of 4.5 volts and a zero DC bias voltage between the first gate and the source. These particular curves were measured at a frequency of 10 GHz and are taken from the article entitled, "Performance of Dual-Gate GaAs MESFET's as Gain Controlled Low-Noise Amplifiers and High-Speed Modulators" by Charles A. Liechti which appeared in the IEEE Transactions on Microwave Theory and Techniques, Vol. MTT-23, No. 6, June 1975, pp. 461-469. This article is incorporated herein by reference.

These characteristics of the dual gate FET are used to control the relative phase and gain of the output signals. Capacitively terminating the second gates in both legs yields an equal-phase power splitter. The optimum capacitance for such a termination depends on the characteristics of the FET device and the intended operating frequency of the power splitter and is generally in the 20 pf to 30 pf range at 10 GHz. Capacitively terminating the second gate in one leg and inductively terminating the second gate in the other leg provides the ability to select a relative phase difference between the output signals by selection of the bias voltage on the second gate which is inductively terminated. The optimum value of the terminating inductance depends on the characteristics of the FET device and the operating frequency and is generally in the 1 nh to 2 nh range at 10 GHz. Equal gains in both legs can be obtained in either case because of the similar gain vs. bias behavior of these FET devices for both capacitive and inductive termination of their second gates and because the phase shift of an FET device having a capacitively terminated second gate is almost independent of bias. Phase differences of as much as 60° can be obtained without introducing losses.

Optimum values for the terminating capacitance or inductance can be experimentally determined by biasing the second gate of an FET device, 41 for example, at the voltage which provides maximum gain and then varying the terminating reactance to provide a reflection coefficient of unity amplitude and a phase angle of substantially −45° for a capacitive termination or substantially 153° for an inductive termination. This reflection coefficient is measured at the terminal set 48 (or 68 for an inductive termination). The transmission phase and gain of the FET is less sensitive to changes in the value of a terminating capacitor than it is to changes in the value of a terminating inductor. This is in keeping with the relative insensitivity of transmission phase shift to a second gate bias voltage when the second gate is capacitively terminated (curve 302) and the linear variation of transmission phase shift with second gate bias voltage when the second gate is inductively terminated (curve 304).

This power splitter has a number of advantages over the prior art passive device techniques. First, since it is entirely comprised of active devices disposed in an integrated form, it is much more compact than either interdigitated microstrip couplers or Wilkinson dividers. Second, since each of the transistors can be operated in a manner to provide both gain and a desired relative phase shift, no separate amplifying stage is needed. This contrasts with the prior art where separate amplifying stages are often needed in order to maintain transmitted signals at desired power levels. Third, by selection of the terminating reactances 47 and 67, and the second gate bias levels, either an equal-phase or a non-equal phase power splitter may be provided. If desired, unequal power splits can be provided by appropriate choices of second gate bias voltages.

From the curves in FIGS. 4 and 5, it can be seen that it would be possible to obtain a relative phase shift of 90° in a single stage. However, in order to do so, the inductively terminated channel would produce a loss. In order to provide gain, where a quadrature power splitter is desired, it is preferred to include two series connected FET devices in each coupling path as is shown in circuit 20 of FIG. 2. To provide the quadrature power split, both FET devices in one leg are capacitively terminated to provide relative transmission phase shifts of 0° and the FET devices in the other leg are inductively terminated to provide relative transmission phase shifts of 45° each. Power splitter 20 has a common input terminal 22, and branch terminals 24 and 26. Power splitter 20 is similar to the power splitter 10 except for the presence of a second dual gate FET in each of its legs. Its upper leg 40' comprises lead 140 and a dual gate FET device 41 like that in leg 40 and a second dual gate FET device 51 whose source 52 is connected to ground. The first gate 53 of FET device 51 is connected via a coupling network 30 to the drain 45 of FET device 41. The second gate 54 is connected to the second gate 44 of FET device 41 and thus is reactively terminated by a capacitor 47' and is connected to the same source 46 of a controllable DC bias. The drain 55 of FET device 51 is connected to the branch output terminal 24 via another coupling network 30.

Leg 60' of power splitter 20 is similar to the leg 60 with lead 160 and FET device 61 except for the presence of the second dual gate FET device 71 connected in series with FET device 61. FET 61 has its second gate 64 inductively terminated by inductor 67' which couples gate 64 to bias supply 66. FET device 71 has its source 72 connected to ground. The first gate 73 of FET device 71 is connected via coupling network 30 to the drain 65 of FET device 61. The second gate 74 of FET device 71 is coupled to bias source 66 by an inductor 77 and is thereby reactively terminated. The drain 75 of FET device 71 is connected to the branch output terminal 26 via another coupling network 30.

Separate terminating inductors are used in lower leg 60' to prevent coupling between second gates 64 and 74. A single terminating capacitor can be used in upper leg 40' because that capacitor's impedance is low enough that it does not cause coupling between gates 44 and 54. However, separate capacitors may be used.

The operation of power splitter 20 is similar to that of power splitter 10 except for the presence in each coupling path of two FET devices. The coupling of the first gate 53 of FET device 51 to the drain 45 of FET device 41 causes the output signal from FET device 41 to modulate the source-drain current of FET device 51. The gain of FET device 51 causes the output power available at terminal 24 to be greater than the power available at terminal 14 of coupler 10, for the same input signal. The operation of the lower coupling path 60' is similar to that of upper path 40'.

To cause power splitter 20 to function as a quadrature power splitter, the bias voltages from sources 46 and 66 are selected to provide the same gain in each leg and to cause the signal transmitted through FET devices 61 and 71 of leg 60' to experience a transmission phase shift of 90° relative to that experienced by the signal transmitted through FET devices 41 and 51 of leg 40'. This is preferably achieved by each of the transistors 41 and 51 providing a reference transmission phase shift while each of the transistors 61 and 71 provides an added relative phase shift of 45°.

Figure 2:
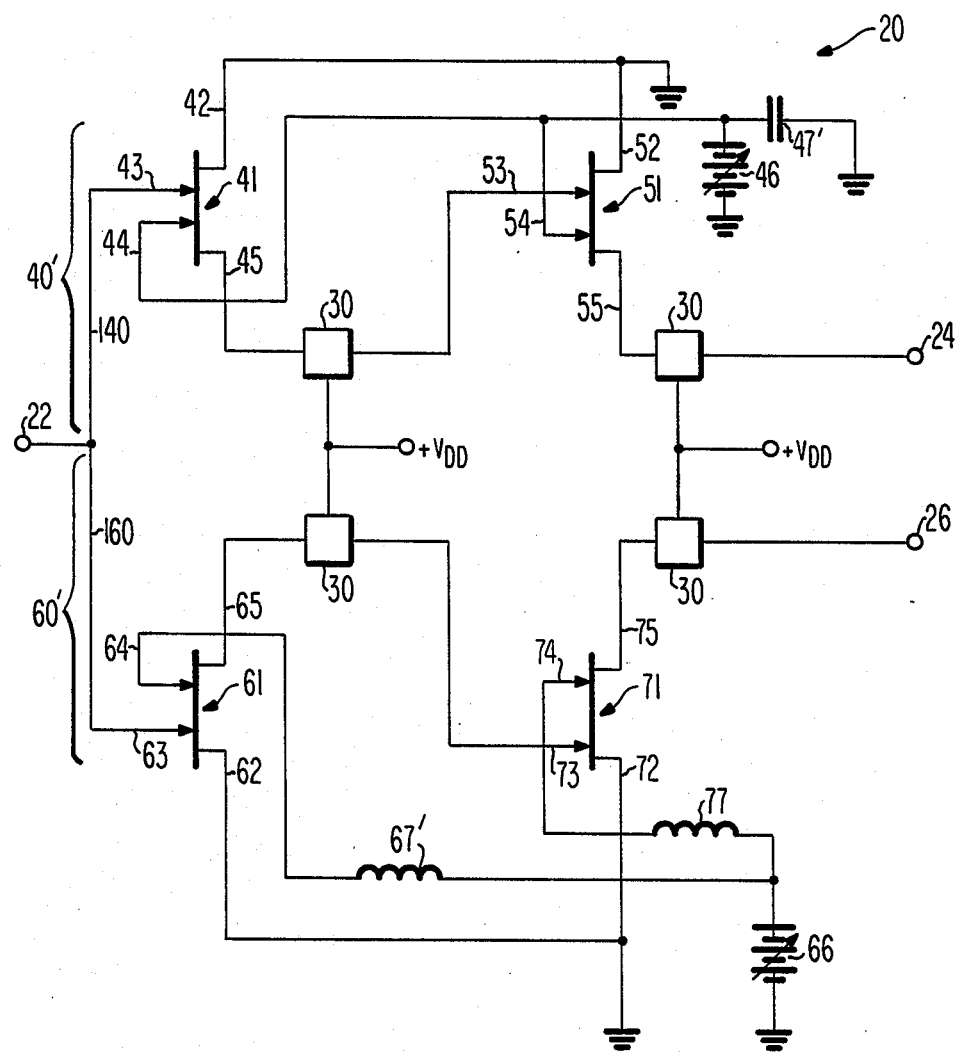
FIG. 2 is a schematic circuit diagram of a power splitter in accordance with the present invention which can produce a 90° relative phase shift between its output signals.
Figure 3:
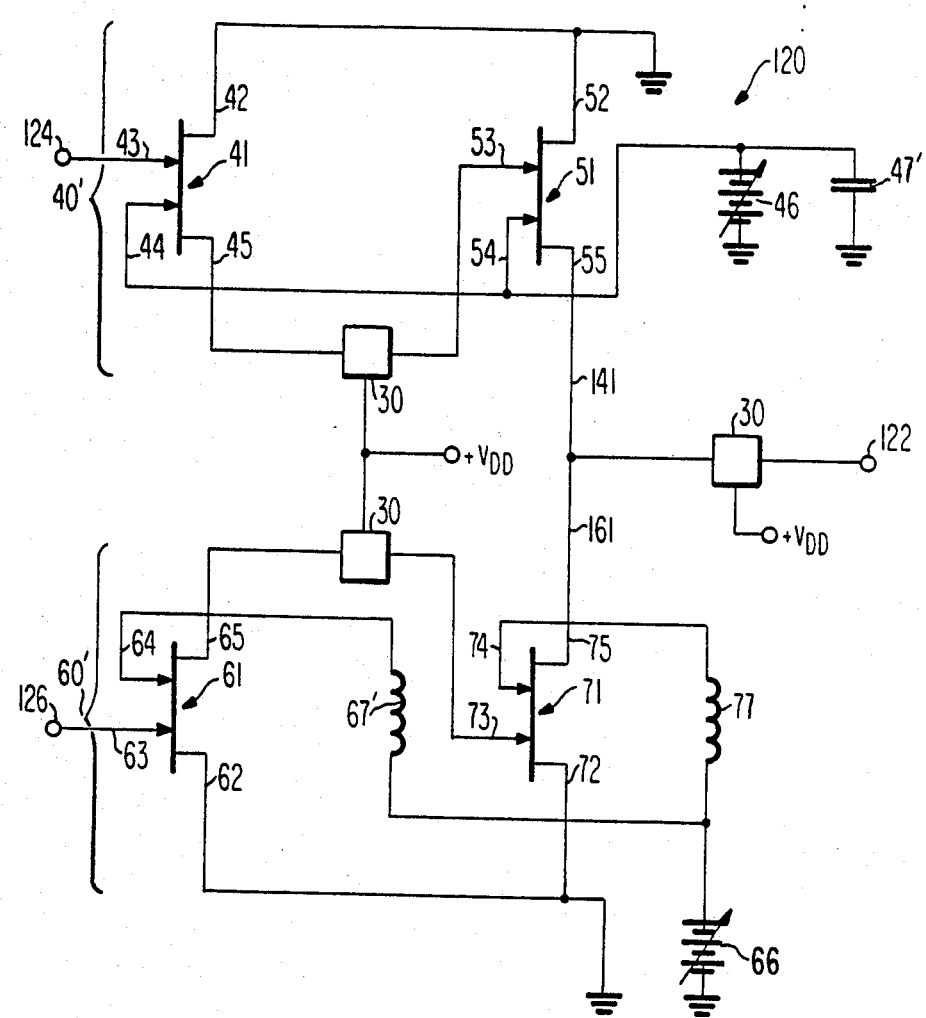
FIG. 3 is a schematic circuit diagram of a power combiner in accordance with the invention.

In FIG. 3, the coupler of FIG. 2 is shown reconfigured as a power combiner 120. The combiner has two branch input terminals 124 and 126 and a common output terminal 122. The first gate 43 of FET device 41 is connected to input terminal 124 and the first gate of FET device 61 is connected to input terminal 126. The drains 55 and 75 of FET devices 51 and 71 are connected via leads 141 and 161 to each other and to common output terminal 122 via a coupling network 30. The remainder of the combiner 120 is like power splitter 20. Combiner 120 as shown will function as a quadrature combiner if the bias voltages 46 and 66 are selected to produce a 90° difference in phase shift. Combiner 120 can be converted to an equal phase combiner by making the second gate terminations all the same type (all capacitive or all inductive) and by making the voltages at 46 and 66 equal.

The first of two signals to be combined by combiner 120 is coupled to branch terminal 124 and the second signal is coupled to branch terminal 126. These signals propagate through the coupling paths 40' and 60' in the same manner as in power splitter 20 until the drains 55 and 75 are reached. There, the two signals merge to form one signal because of the common connection of the drains 55 and 75.

Power splitter 10 of FIG. 1 can be converted into a single stage power combiner in a similar fashion.

The present invention has been illustrated and described in terms of branching circuits having two branches. The concepts employed are applicable to such circuits having more than two branches. In the circuits illustrated, the FETs are shown with their sources grounded and their drains biased at a $+V_{DD}$ of 4.5 volts. If desired, these devices can be operated with different power supply potentials.

What is claimed is:

1. An RF coupler for connecting RF signals within an operating RF frequency band between two branch terminals and a common terminal, comprising:
   first and second leads each having one end joined to said common terminal;
   said first lead coupled to a first one of said branch terminals through a first dual gate FET device having its second gate terminated by a first reactance which is capacitive in said operating RF frequency band; said second lead coupled to the second one of said branch terminals through a second dual gate FET device having its second gate terminated by a second reactance which is inductive in said operating RF frequency band; and
   means for providing DC bias to the sources, drains, and second gates of said first and second dual gate FET devices, said means for providing DC bias supplying a value of bias to said second gate of said first dual gete FET device which in cooperation with said first reactance yields a desired reference transmission phase shift between said common terminal and said first branch terminal and supplying a value of bias to said second gate of said second dual gate FET device which in cooperation with said second reactance yields a transmission phase shift between said common terminal and said second branch terminal which differs from said reference phase shift by a desired, non-zero, relative phase shift of $\phi$ degrees.

2. The coupler recited in claim 1 wherein:
   said relative phase shift $\phi$ is substantially 90 degrees or less.

3. The coupler recited in claim 2 wherein $\phi$ is substantially 45.

4. The coupler recited in claim 1 wherein:
   said bias value on said second gate of said first transistor produces a gain of K; and said bias value on said second gate of said second transistor is additionally selected to produce a gain of K.

5. The coupler recited in claim 1 wherein:
said first lead has its second end coupled to the first gate of said first FET device;
said second lead has its second end coupled to the first gate of said second FET device;
the drain of said first FET device is coupled to said first branch terminal; and
the drain of said second FET device is coupled to said second branch terminal whereby said coupler functions as a power splitter.

6. The coupler recited in claim 1 wherein:
said first lead has its second end coupled to the drain of said first FET device;
said second lead has its second end coupled to the drain of said second FET device;
the first gate of said first FET device is coupled to said first branch terminal; and
the first gate of said second FET device is coupled to said second branch terminal whereby said coupler functions as a power combiner.

7. The coupler recited in claim 1 including:
a third dual gate FET device having its first gate coupled to the drain of said first FET device and its second gate reactively terminated by a reactance of the same type as said first reactance; and
a fourth dual gate FET device having its first gate coupled to the drain of said second FET device and its second gate reactively terminated by a reactance of the same type as said second reactance;
said means for providing DC bias providing DC bias to the sources, drains and second gates of said third and fourth FET devices.

8. The coupler recited in claim 7 wherein said first reactance is capacitive and said second reactance is inductive, the values of said reactances and said bias at said second gates being selected whereby said coupler is a quadrature coupler.

9. A coupler for connecting RF signals between two branch terminals and a common terminal comprising:
first and second leads each having one end joined to said common terminal;
said first lead coupled to a first one of said branch terminals through a series connection of first and second dual gate FET devices, said first dual gate FET device having its second gate capacitively terminated, said second dual gate FET device having its first gate coupled to the drain of said first dual gate FET devices and having its second gate capacitively terminated, means for applying biasing potential to said first and second FET devices, said second gates of said first and second FET devices being biased at a voltage which causes a signal transmitted between said common terminal and said first branch terminal to experience a reference phase shift; and
said second lead coupled to the second one of said branch terminals through a series connection of third and fourth dual gate FET devices, said third dual gate FET device having its second gate inductively terminated, said fourth dual gate FET device having its first gate coupled to the drain of said third dual gate FET device and having its second gate inductively terminated, means for applying biasing potentials to said third and fourth FET devices, said second gates of said third and fourth dual gate FET devices being biased at a voltage which causes a signal transmitted between said common terminal and said second branch terminal to experience a relative phase shift of substantially 90° with respect to said reference phase shift.

10. The coupler of claim 9 wherein:
said bias voltage on said second gates of said third and fourth FET devices produces a gain of K between said common terminal and second branch terminal; and
said bias voltage on said second gates of said first and second FET devices is selected to produce a gain of substantially K between said common terminal and said first branch terminal.

* * * * *